United States Patent
Wang et al.

(10) Patent No.: US 12,136,566 B2
(45) Date of Patent: Nov. 5, 2024

(54) SEMICONDUCTOR DEVICE AND METHOD OF MANUFACTURE

(71) Applicant: Taiwan Semiconductor Manufacturing Co., Ltd., Hsinchu (TW)

(72) Inventors: Yu-Shih Wang, Tainan (TW); Po-Nan Yeh, Hsinchu (TW); U-Ting Chiu, Hsinchu (TW); Chun-Neng Lin, Hsinchu (TW); Chia-Cheng Chen, Hsinchu (TW); Liang-Yin Chen, Hsinchu (TW); Ming-Hsi Yeh, Hsinchu (TW); Kuo-Bin Huang, Jhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 11 days.

(21) Appl. No.: 17/969,396

(22) Filed: Oct. 19, 2022

(65) Prior Publication Data

US 2023/0041753 A1 Feb. 9, 2023

Related U.S. Application Data

(63) Continuation of application No. 16/906,615, filed on Jun. 19, 2020, now Pat. No. 11,488,857.
(Continued)

(51) Int. Cl.
  *H01L 21/768* (2006.01)
  *H01L 23/522* (2006.01)
  *H01L 23/532* (2006.01)

(52) U.S. Cl.
  CPC .. *H01L 21/76825* (2013.01); *H01L 21/76804* (2013.01); *H01L 21/76829* (2013.01); *H01L 23/5226* (2013.01); *H01L 23/5329* (2013.01)

(58) Field of Classification Search
  CPC ......... H01L 21/76825; H01L 21/76804; H01L 21/76829; H01L 23/5226; H01L 23/5329;
  (Continued)

(56) References Cited

U.S. PATENT DOCUMENTS 5,985,753 A * 11/1999 Yu ..................... H01L 21/0337
                                                    438/622
6,514,844 B1   2/2003 Martin et al.
(Continued)

FOREIGN PATENT DOCUMENTS

CN        1579017 A    2/2005
CN      105679651 A    6/2016
(Continued)

*Primary Examiner* — Shahed Ahmed
*Assistant Examiner* — Vicki B. Booker
(74) *Attorney, Agent, or Firm* — Slater Matsil, LLP

(57) ABSTRACT

Semiconductor devices and methods of manufacture are described herein. A method includes forming an opening through an interlayer dielectric (ILD) layer to expose a contact etch stop layer (CESL) disposed over a conductive feature in a metallization layer. The opening is formed using photo sensitive materials, lithographic techniques, and a dry etch process that stops on the CESL. Once the CESL is exposed, a CESL breakthrough process is performed to extend the opening through the CESL and expose the conductive feature. The CESL breakthrough process is a flexible process with a high selectivity of the CESL to ILD layer. Once the CESL breakthrough process has been performed, a conductive fill material may be deposited to fill or overfill the opening and is then planarized with the ILD layer to form a contact plug over the conductive feature in an intermediate step of forming a semiconductor device.

20 Claims, 8 Drawing Sheets

Related U.S. Application Data

(60) Provisional application No. 62/928,671, filed on Oct. 31, 2019.

(58) Field of Classification Search
CPC ......... H01L 21/76831; H01L 21/76814; H01L 23/528; H01L 2221/101
See application file for complete search history.

(56) References Cited

U.S. PATENT DOCUMENTS

| | | | |
|---|---|---|---|
| 6,610,594 B2 | 8/2003 | Apelgren et al. | |
| 6,998,343 B1 * | 2/2006 | Sun | H01L 21/76826 438/653 |
| 9,105,490 B2 | 8/2015 | Wang et al. | |
| 9,236,267 B2 | 1/2016 | De et al. | |
| 9,236,300 B2 | 1/2016 | Liaw | |
| 9,406,804 B2 | 8/2016 | Huang et al. | |
| 9,443,769 B2 | 9/2016 | Wang et al. | |
| 9,520,482 B1 | 12/2016 | Chang et al. | |
| 9,548,366 B1 | 1/2017 | Ho et al. | |
| 9,576,814 B2 | 2/2017 | Wu et al. | |
| 9,831,183 B2 | 11/2017 | Lin et al. | |
| 9,859,386 B2 | 1/2018 | Ho et al. | |
| 2002/0173158 A1 | 11/2002 | Jeng | |
| 2003/0013296 A1 | 1/2003 | Apelgren et al. | |
| 2007/0152343 A1 * | 7/2007 | Richter | H01L 21/76846 257/E21.507 |
| 2007/0155157 A1 | 7/2007 | Chou et al. | |
| 2007/0178685 A1 | 8/2007 | Peters et al. | |
| 2008/0026487 A1 | 1/2008 | Feustel et al. | |
| 2009/0020880 A1 | 1/2009 | Paik | |
| 2011/0223759 A1 | 9/2011 | Wang et al. | |
| 2016/0240428 A1 | 8/2016 | Tung et al. | |
| 2016/0351669 A1 | 12/2016 | Shiao et al. | |
| 2017/0278743 A1 | 9/2017 | Tsai et al. | |
| 2018/0040733 A1 | 2/2018 | Chang et al. | |
| 2018/0166329 A1 | 6/2018 | Huang et al. | |
| 2018/0337090 A1 | 11/2018 | Shen et al. | |

FOREIGN PATENT DOCUMENTS

| | | |
|---|---|---|
| CN | 108933100 A | 12/2018 |
| TW | 573341 B | 1/2004 |

* cited by examiner

SEMICONDUCTOR DEVICE AND METHOD OF MANUFACTURE

PRIORITY CLAIM AND CROSS-REFERENCE

This application is a continuation of U.S. patent application Ser. No. 16/906,615, filed Jun. 19, 2020, entitled "Semiconductor Device and Method of Manufacture," which claims the benefit of U.S. Provisional Application No. 62/928,671, filed on Oct. 31, 2019, entitled "Semiconductor Device and Method of Manufacture," which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
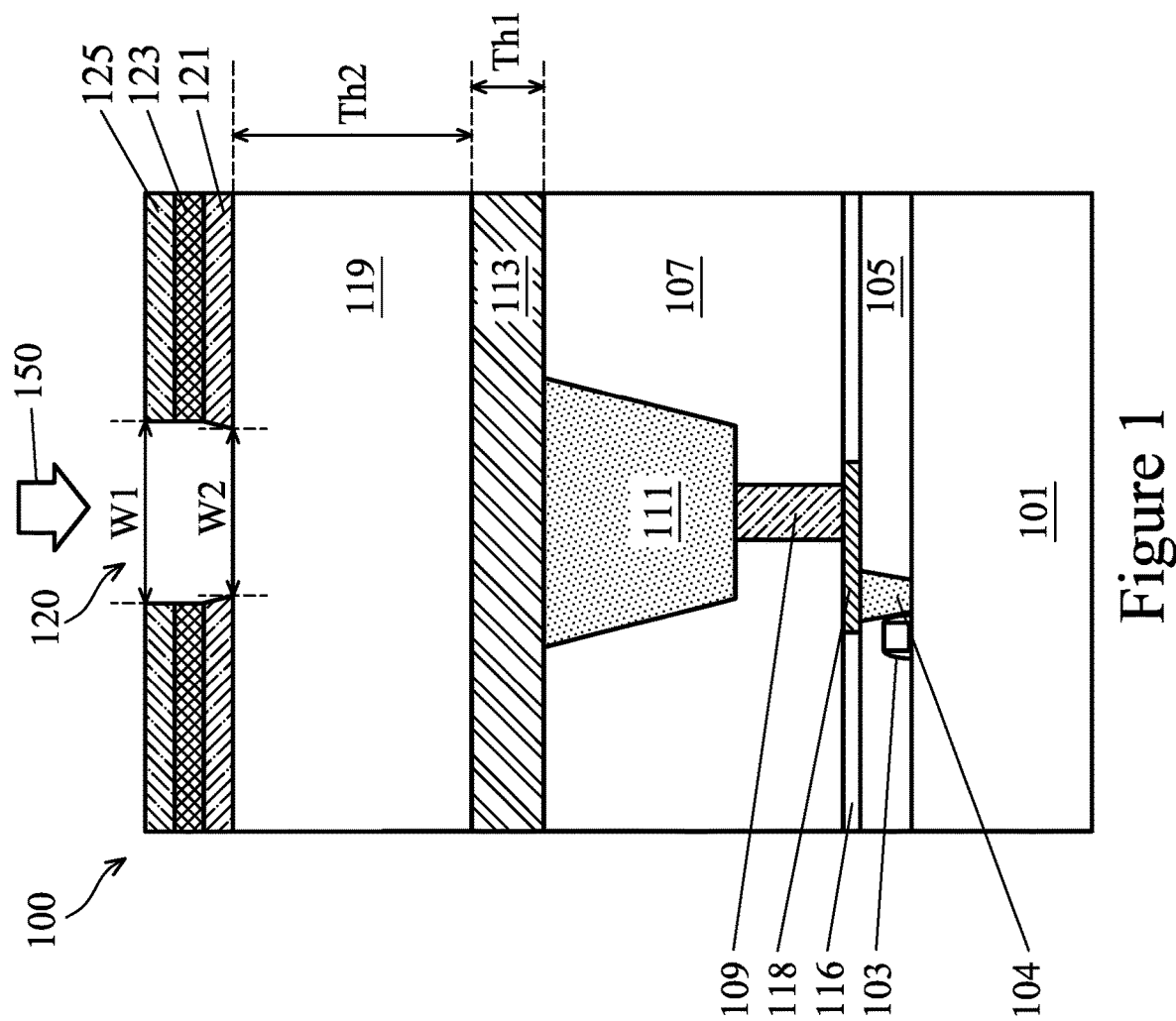
FIG. 1 illustrates a patterning of a hardmask layer, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to an etching process for hardmasks and etch stop layer removal in a middle end of line process of a 3 nm process node. However, the embodiments described herein may be used in a wide variety of applications, and the discussions should not be interpreted as limiting the embodiments.

With reference now to FIG. 1, there is illustrated a first patterning process 150 for forming an opening 120 in an intermediate structure of a semiconductor device 100, according to some embodiments. The intermediate structure of FIG. 1 comprises a semiconductor substrate 101, active devices 103 within an active region (or oxide definition (OD) region) of the semiconductor substrate 101, an interlayer dielectric layer 105 over the active devices 103, contact plugs 104, a first dielectric layer 116, a contact plug trench 118, a second dielectric layer 107, and a first via 109 and a conductive trench 111 located within the second dielectric layer 107. In an embodiment the semiconductor substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The active devices 103 may be formed in and/or over the semiconductor substrate 101. As one of ordinary skill in the art will recognize, a wide variety of active devices and passive devices such as transistors, capacitors, resistors, combinations of these, and the like may be used to generate the desired structural and functional requirements of the design for the semiconductor device 100. The active devices 103 may be formed using any suitable methods.

The interlayer dielectric layer 105 is formed over the active devices 103 in order to protect and isolate the active devices 103. In an embodiment the interlayer dielectric layer 105 may comprise a material such as boron phosphorous silicate glass (BPSG), although any suitable dielectrics may be used for either layer. The interlayer dielectric layer 105 may be formed using a process such as PECVD, although other processes, such as LPCVD, may also be used. The interlayer dielectric layer 105 may be formed to a thickness of between about 100 Å and about 3,000 Å.

Once the interlayer dielectric layer 105 has been formed, contact plugs 104 may be formed through the interlayer dielectric layer 105 to electrically connect the active devices 103 with the overlying structures. In an embodiment the formation of the contact plugs 104 may be initiated by first forming contact plug openings through the interlayer dielectric layer 105 to expose a conductive portion of the active devices 103. In an embodiment the contact plug openings may be formed using a suitable photolithographic masking and etching process.

Once the contact plug openings have been formed, a formation of a first glue layer (not separately illustrated in FIG. 1) may be initiated. In an embodiment the first glue layer is utilized to help adhere the rest of the contact plugs 104 to the underlying structure and may be, e.g., tungsten, titanium nitride, tantalum nitride, or the like formed using a process such as CVD, plasma enhanced chemical vapor deposition (PECVD), physical vapor deposition (PVD), atomic layer deposition (ALD), and the like or the like.

Once the first glue layer has been formed, the remainder of the contact plugs 104 is formed in contact with the glue layer. In an embodiment the material of the contact plugs 104 is tungsten (W), although any other suitable material, such as aluminum, copper, cobalt, a combinations of these, or the like, may be utilized. The material of the contact plugs 104 may be formed using a process such as CVD, although any suitable process, such as PECVD, physical vapor deposition (PVD), atomic layer deposition (ALD), and the like, may be utilized.

Once filled, a planarization of the contact plugs 104 is performed such that the material of the contact plugs 104 that is outside of the interlayer dielectric layer 105 is removed, forming the contact plugs 104 (one of which is illustrated in FIG. 1). In an embodiment the planarization process is a chemical mechanical polish (CMP), in which a combination of etching materials and abrading materials are put into contact with the material of the contact plugs 104 and a grinding pad (not separately illustrated) is used to grind away the material of the contact plugs 104 until all of the material of the contact plugs 104 over the interlayer dielectric layer 105 has been removed.

The first dielectric layer 116 may be formed over the interlayer dielectric layer 105. The first dielectric layer 116 may be made of one or more suitable dielectric materials such as low-k dielectrics such as carbon doped oxides, extremely low-k dielectrics such as porous carbon doped silicon dioxide, silicon oxide, silicon nitride, a polymer such as polyimide, combinations of these, or the like. The first dielectric layer 116 may be formed through a process such as a spin-on process or a chemical vapor deposition (CVD), although any suitable process may be utilized, and may have a thickness of between about 400 Å and about 1000 Å, such as about 600 Å.

Once the first dielectric layer 116 has been formed, a contact plug trench 118 may be formed to connect the contact plugs 104 to overlying metallization layers and, in some embodiments, each other. In an embodiment the contact plug trench 118 may be formed using a damascene process, whereby an opening is formed within the first dielectric layer 116 to expose the contact plugs 104, and the opening is then filled with a conductive material. In another embodiment, the contact plug trench 118 and the contact plugs 104 may be formed simultaneously using, e.g., a dual damascene process. Any suitable method of manufacturing the contact plugs 104 and the contact plug trench 118 may be utilized.

The second dielectric layer 107 may be formed over the first dielectric layer 116. The second dielectric layer 107 may be made of one or more suitable dielectric materials such as low-k dielectrics such as carbon doped oxides, extremely low-k dielectrics such as porous carbon doped silicon dioxide, silicon oxide, silicon nitride, a polymer such as polyimide, combinations of these, or the like. The second dielectric layer 107 may be formed through a process such as a spin-on process or a chemical vapor deposition (CVD), although any suitable process may be utilized, and may have a thickness of between about 400 Å and about 1000 Å, such as about 600 Å.

FIG. 1 additionally illustrates formation of conductive features (e.g., conductive vias, conductive trenches, metallization layers, conductive traces, conductive lines, metal pads, metal pillars, combinations thereof, and the like) within the second dielectric layer 107. In an embodiment, the conductive features may comprise a first via 109 and a conductive trench 111 which may be formed using, e.g., a dual damascene process, whereby an opening for both the first via 109 and the conductive trench 111 is first formed within the second dielectric layer 107. In an embodiment the opening may be formed by placing and patterning a photoresist material over the second dielectric layer 107. Once the photoresist material has been placed and patterned, a dry etch process such as a reactive ion etch may be utilized to transfer the pattern from the patterned photoresist to the underlying second dielectric layer 107. This process may be repeated to form both of the via portion of the opening and the trench portion of the opening.

Once the opening has been formed, the opening may be filled with a conductive material in order to form the first via 109 and the conductive trench 111 within the second dielectric layer 107. In an embodiment the formation of the conductive material may be initiated by first depositing a barrier layer (not separately illustrated in FIG. 1). The barrier layer may be a barrier material such as titanium nitride or tantalum nitride which may be deposited using a deposition process such as chemical vapor deposition, physical vapor deposition, atomic layer deposition, or the like. However, any suitable material or method of deposition may be utilized to form the barrier layer.

Once the barrier layer has been formed, the conductive material may be deposited to fill and/or overfill the openings within the second dielectric layer 107. In an embodiment the conductive material may be a material such as copper, tungsten, cobalt, ruthenium, titanium dioxide, aluminum, alloys, doped polysilicon, combinations of these, or the like, formed, e.g., using a seed layer (not shown) and a plating process, such as electrochemical plating, although other processes of formation, such as sputtering, evaporation, or a PECVD process, may also be used depending upon the desired materials. Once the openings have been filled with conductive material, any excess conductive material outside of the openings may be removed, and the conductive trench 111 and the second dielectric layer 107 may be planarized using, for example, a chemical mechanical polishing process.

FIG. 1 also illustrates the beginning process for the formation of another metallization layer (over the metallization layer formed by the first via 109 and the conductive trench 111). In an embodiment a contact etch stop layer 113, and a third dielectric layer 119 are formed over the second dielectric layer 107.

The contact etch stop layer 113 is used to protect the underlying structures and provide a control point for subsequent etching processes. In one embodiment, the contact etch stop layer 113 may be formed of aluminum oxide ($AlO_x$) using plasma enhanced chemical vapor deposition (PECVD), although other materials such as nitrides, carbides, borides, combinations thereof, or the like, and techniques of forming the contact etch stop layer 113, such as low pressure CVD (LPCVD), PVD, or the like, could be used. The contact etch stop layer 113 may be formed to a first thickness Th1 of between about 20 Å and about 2,000 Å, such as about 200 Å.

Optionally, the contact etch stop layer 113 may be a bottom etch stop layer and an optional second etch stop layer (not shown) and/or an optional third etch stop layer (not shown) may be formed over the contact etch stop layer 113. In an embodiment the optional second etch stop layer may be formed of a material such as a carbon doped oxide such as SiOC and the optional third etch stop layer may be formed of a material such as aluminum oxide, although any suitable material, such as aluminum nitride, may also be used. The optional second etch stop layer and the optional third etch stop layer may be formed using a deposition process such as chemical vapor deposition, physical vapor deposition, atomic layer deposition, or the like, and may be deposited to a thickness of between about 10 Å and about 200 Å, such as about 40 Å. However, any suitable materials, deposition processes, and thicknesses may be utilized.

Once the contact etch stop layer 113 has been formed, the third dielectric layer 119 may be formed over the contact etch stop layer 113 as a porous dielectric layer or a non-porous dielectric layer. In an embodiment the third dielectric layer 119 may be, e.g., a low-k dielectric film intended to help isolate interconnects from other structures. By isolating the interconnects, the resistance-capacitance (RC) delay of the interconnects may be reduced, thereby improving the overall efficiency and speed of electricity through the interconnect.

In an embodiment the third dielectric layer 119 may be a porous material or a non-porous material comprising a material such as SiOCN, SiCN or SiOC and may be formed by initially forming a precursor layer over the contact etch stop layer 113. The precursor layer may comprise both a matrix material and a porogen interspersed within the matrix material to form a porous layer, or may also comprise the matrix material without the porogen to form a non-porous layer. In an embodiment the precursor layer may be formed, e.g., by co-depositing the matrix and the porogen using a process such as plasma enhanced chemical vapor deposition (PECVD) where the matrix material is deposited at the same time as the porogen, thereby forming the precursor layer with the matrix material and the porogen mixed together. However, as one of ordinary skill in the art will recognize, co-deposition using a simultaneous PECVD process is not the only process that may be used to form the precursor layer. Any suitable process, such as premixing the matrix material and the porogen material as a liquid and then spin-coating the mixture onto the contact etch stop layer 113, may also be utilized.

The precursor layer may be formed to a thickness sufficient to provide the isolation and routing characteristics that are desired of the third dielectric layer 119. In an embodiment, the precursor layer may be formed to a second thickness Th2 of between about 10 Å and about 2000 Å, such as about 300 Å. However, these thicknesses are meant to be illustrative only, and are not intended to limit the scope of the embodiments, as the precise thickness of the precursor layer may be any suitable desired thickness.

The matrix material, or base dielectric material, may be formed using a process such as PECVD, although any suitable process, such as a chemical vapor deposition (CVD), physical vapor deposition (PVD), or even spin-on coating, may also be utilized. The PECVD process may utilize precursors such as methyldiethoxy silane (DEMS), although other precursors such as other silanes, alkylsilanes (e.g., trimethylsilane and tetramethylsilane), alkoxysilanes (e.g., methyltriethoxysilane (MTEOS), methyltrimethoxysilane (MTMOS), methyldimethoxysilane (MDMOS), trimethylmethoxysilane (TMMOS) and dimethyldimethoxysilane (DMDMOS)), linear siloxanes and cyclic siloxanes (e.g., octamethylcyclotetrasiloxane (OMCTS) and tetramethylcyclotetrasiloxane (TMCTS)), combinations of these, and the like may be utilized. However, as one of ordinary skill in the art will recognize, the materials and processes listed herein are merely illustrative and are not meant to be limiting to the embodiments, as any other suitable matrix precursors may be utilized.

After the precursor layer has been formed with the porogen dispersed within the matrix material, the porogen is removed from the matrix material to form the pores within the matrix material. In an embodiment the removal of the porogen is performed by an annealing process which can break down and vaporize the porogen material, thereby allowing the porogen material to diffuse and leave the matrix material, thereby leaving behind a structurally intact porous dielectric material as the third dielectric layer 119. For example, an anneal of between about 200° C. and about 500° C., such as about 400° C., for between about 10 seconds and about 600 seconds, such as about 200 seconds, may be utilized.

However, as one of ordinary skill in the art will recognize, the thermal process described above is not the only method that may be utilized to remove the porogen from the matrix material to form the third dielectric layer 119. Other suitable processes, such as irradiating the porogen with UV radiation to decompose the porogen or utilizing microwaves to decompose the porogen, may also be utilized. These and any other suitable process to remove all or to remove a portion of the porogen are all fully intended to be included within the scope of the embodiments.

FIG. 1 additionally illustrates a placement of an anti-reflective layer 121. In an embodiment the anti-reflective layer 121 may be a nitrogen-free anti-reflective coating and may be applied to the third dielectric layer 119 so that the material for the anti-reflective layer 121 coats an upper exposed surface of the third dielectric layer 119. According to some embodiments, the anti-reflective layer 121 may be applied using a process such as a spin-on coating process, a dip coating method, an air-knife coating method, a curtain coating method, a wire-bar coating method, a gravure coating method, a lamination method, an extrusion coating method, combinations of these, or the like. In an embodiment the material for the anti-reflective layer 121 may be applied such that it has a thickness of between about 50 nm and about 500 nm, such as about 300 nm. However, any suitable materials, methods of application, and thicknesses may be used.

Once the anti-reflective layer 121 has been formed, a first hardmask 123 may be formed over the anti-reflective layer 121. In an embodiment the first hardmask 123 may be a masking material such as titanium nitride (TiN), although any other suitable material, such as silicon nitride, titanium oxide or a titanium rich material may be used. The first hardmask 123 may be formed using a deposition process such as chemical vapor deposition, physical vapor deposition, atomic layer deposition, combinations of these, or the like, and may be formed to a thickness of between about 50 Å and about 800 Å, such as about 300 Å. However, any suitable materials, deposition process, and thickness may be utilized.

Once formed, the first hardmask 123 may be patterned in order to provide a masking layer for a subsequent etching process to form the opening 120. In an embodiment the first hardmask 123 may be patterned by placing a first photoresist 125 over the first hardmask 123 and then exposing and developing the first photoresist 125 to form a patterned photoresist. Once the first photoresist 125 has been patterned, the pattern of the first photoresist 125 is then transferred to the first hardmask 123 and the anti-reflective layer 121 using, e.g., one or more anisotropic etching processes such as a reactive ion etching process. However, any suitable process may be utilized.

The opening 120 may be formed, in some embodiments, with a first width W1 through the first hardmask 123 and formed with a second width W2 through the anti-reflective layer 121. The second width W2 may be less than the first width W1, although the first width W1 and the second width W2 may also be the same. According to some embodiments, the first width W1 may be between about 10 nm and about 100 nm, such as about 25 nm and the second width W2 may be between about 10 nm and about 100 nm, such as about 25 nm. However, any suitable widths may be utilized.

Figure 2:
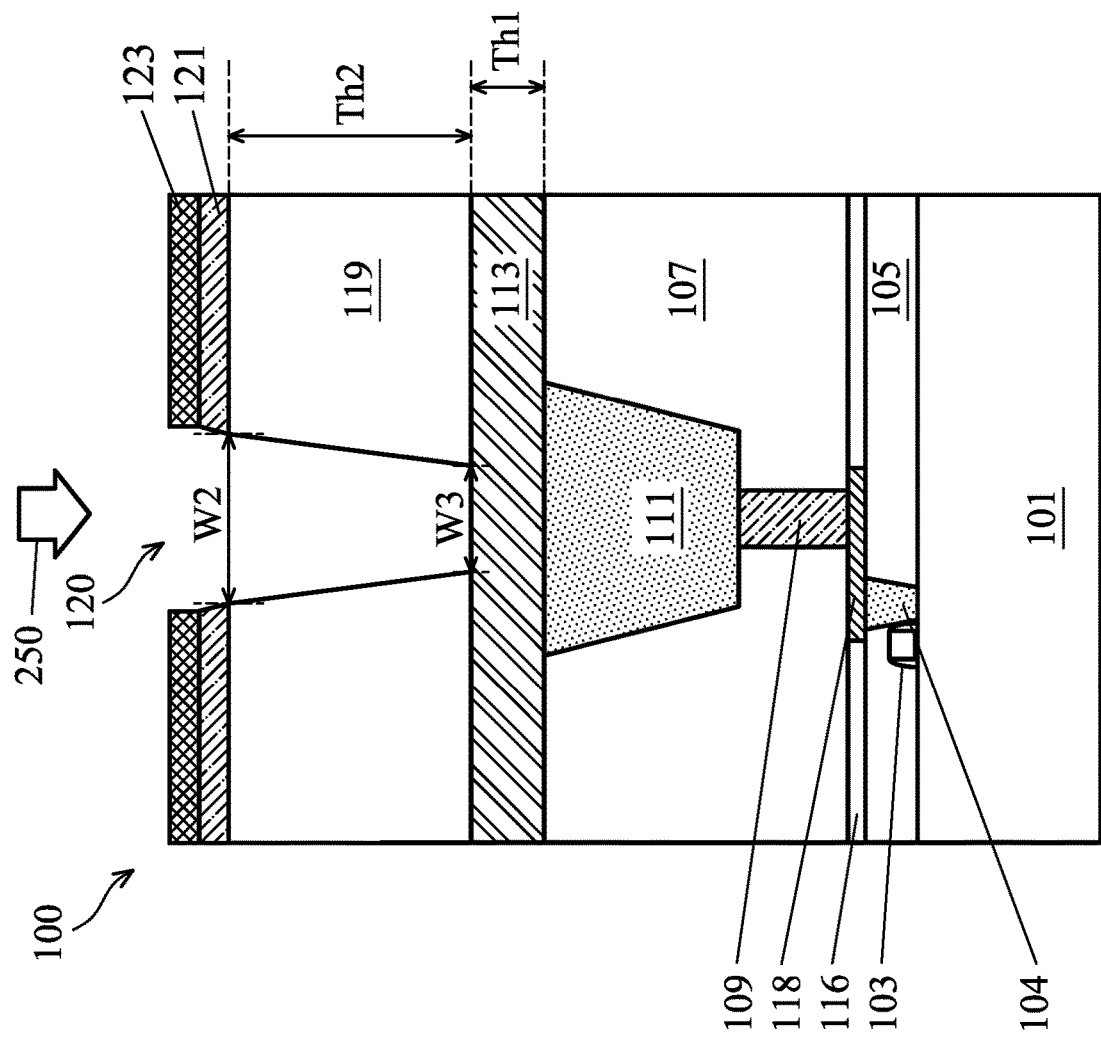
FIG. 2 illustrates an etching of a dielectric layer, in accordance with some embodiments.

FIG. 2 illustrates a first etching process 250 to extend the opening 120 through the third dielectric layer 119 and expose the contact etch stop layer 113, according to some embodiments. Once patterned, the first hardmask 123 may be used as a mask in the first etching process 250 to form the opening 120 in the third dielectric layer 119. In an embodiment the first etching process 250 is a dry etch, e.g., an anisotropic etching process such as a reactive ion etch with etchants suitable to etch the third dielectric layer 119. However, any suitable etching process may be utilized.

Once the opening 120 has been formed, the first photoresist 125 is removed. In an embodiment the first photoresist 125 is removed using a process such as ashing, whereby the temperature of the first photoresist 125 is increased until the first photoresist 125 experiences a thermal decomposition, at which point the first photoresist 125 may be easily removed. However, other suitable processes, such as a wet or dry etch, or even removing the first photoresist 125 using the same etching process that forms the opening 120, may be used.

In some embodiments, the first etching process 250 etches through the third dielectric layer 119 and exposes the contact etch stop layer 113 in a single etching step. In other embodiments, the first etching process 250 may comprise a plurality of etching steps including an initial etching step to etch into, but not through, the third dielectric layer 119. The initial etching step is followed by one or more subsequent etching steps to extend the opening 120 all the way through the third dielectric layer 119 and expose the contact etch stop layer 113. The one or more subsequent etching steps include subsequent photoresist depositions, subsequent photoresist patterning, subsequent etches into the third dielectric layer 119, and subsequent photoresist removals. In an embodiment, the subsequent photoresist may comprise a tri-layer photoresist, with a bottom anti-reflective coating (BARC) layer, an intermediate mask layer, and a top photoresist layer. However, any suitable types of photosensitive materials or combinations of materials may be utilized.

The opening 120 may have a third width W3 at the exposed surface of the contact etch stop layer 113. The third width W3 may be smaller than the second width W2 of the opening 120, although the second width W2 and the third width W3 may also be the same. According to some embodiments, the third width W3 may be between about 8 nm and about 80 nm, such as about 20 nm. However, any suitable widths may be used.

The material of the contact etch stop layer 113 may be chosen to stop or at least slow down the first etching process 250 and prevent the first etching process 250 from etching through the contact etch stop layer 113. As such, the opening 120 may extend into, but not through, the contact etch stop layer 113. However, any suitable etch stop material or combination of materials and any suitable etching methods or combination of etching methods may be utilized.

Figure 3A:
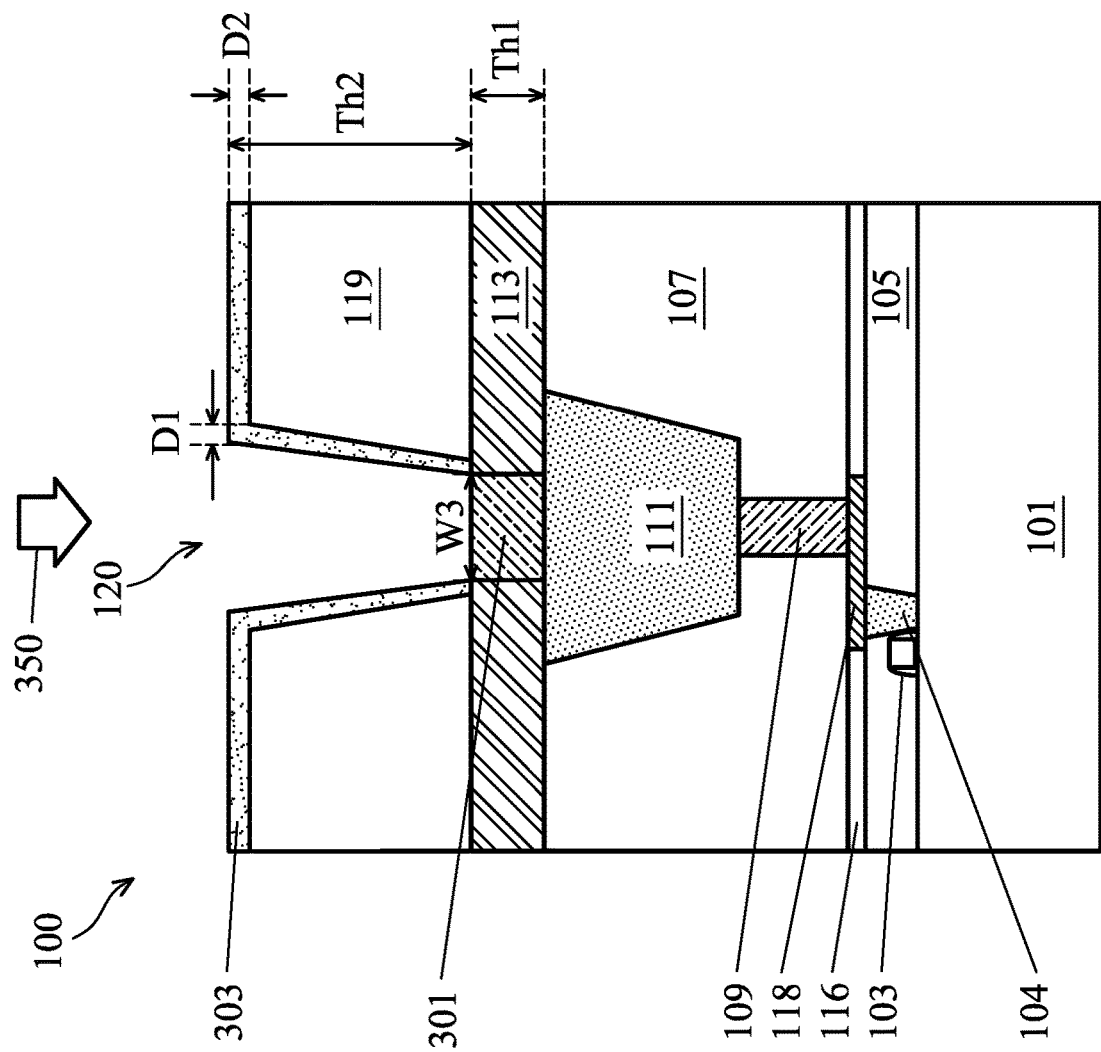
FIGS. 3A-3B illustrate a breakthrough process to form an opening through an etch stop layer, in accordance with an embodiment.
Figure 3B:
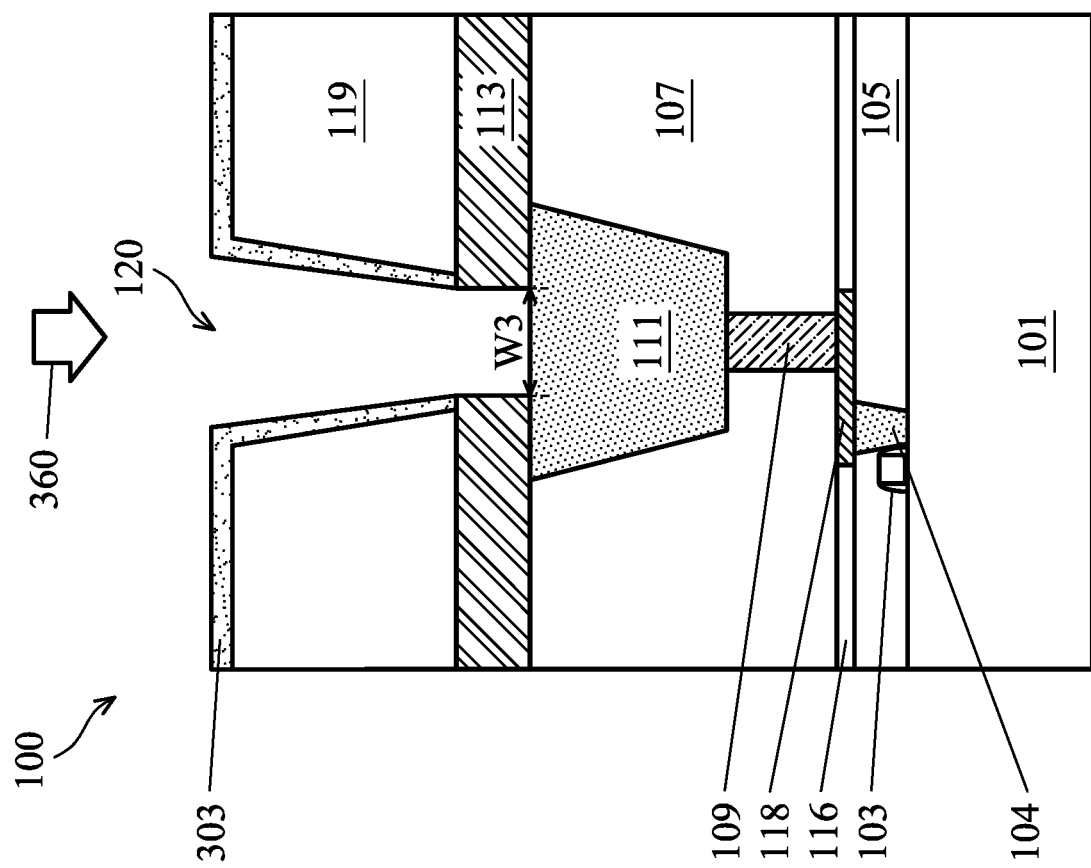

FIGS. 3A and 3B illustrate intermediate steps in a breakthrough process for extending the opening 120 through the etch stop layer 113 and exposing the conductive trench 111, according to some embodiments. The breakthrough process comprises a breakthrough implant 350 (illustrated in FIG. 3A) and a wet breakthrough 450 (illustrated in FIG. 3B) and may be conducted in a chamber suitable for supporting the semiconductor device 100 and dispensing etchants selective to the materials being removed. According to some embodiments, the breakthrough process may be performed as part of or in combination with a post via etch cleaning process in the opening 120 and/or prior to forming a metal plug in the opening 120. In some embodiments, the first hardmask 123 and/or the anti-reflective layer 121 are removed prior to performing the breakthrough process and in other embodiments they are removed during the breakthrough process.

According to some embodiments, the removal of the first hardmask 123 and the anti-reflective layer 121 may be performed during a same removal step or may be removed in separate steps. According to some embodiments, one or more liquid etchants that are selective to the materials of the first hardmask 123 (e.g., TiN) and the anti-reflective layer 121 are used to remove the first hardmask 123 and the anti-reflective layer 121. However, any other suitable removal processes, such as an ashing process, may also be utilized.

FIG. 3A further illustrates a breakthrough implant 350, in accordance with some embodiments. As an initial step of the etch stop breakthrough process, the breakthrough implant 350 is performed in a target region 301 of the contact etch stop layer 113. The breakthrough implant 350 may be conducted in a chamber suitable for supporting the semiconductor device 100 and suitable for implanting dopants into the materials being removed.

According to some embodiments, the breakthrough implant 350 is performed using an ion beam acceleration system to implant dopants into the exposed contact etch stop layer 113 within the opening 120. The source material of the dopants, implantation energy level, and implantation concentration level may be chosen based on a desired selectivity of the contact etch stop layer 113 in the target region 301 being removed and/or a desired implantation pattern or concentration into other materials exposed within the opening 120. According to some embodiments, the etch stop breakthrough process comprises one or more physical implant processes and/or chemical implant processes using dopants such as argon (Ar), fluorine (F), difluoroboron ($BF_2$), combinations thereof, or the like for assisting in removing the etch stop layer 113 (e.g., $AlO_x$) exposed within the opening 120.

In a physical implant process, an inert dopant material such as argon (Ar), fluorine (F), difluoroboron (BF2), combinations of these, or the like, is used to help remove the etch stop layer 113 exposed within the opening 120. During the physical implant process, the ion beam system may be used to accelerate ions of the inert dopant material (e.g., argon) into the target region 301 with enough energy to disrupt the crystalline structure of the etch stop layer 113 such that molecules of the material are dislocated from one another. As such, the dislocated material of the etch stop layer 113 may more easily mix and/or react with reactant agents and solvents used to assist in the removal of the dislocated materials and/or the ions of the dopant material from the opening 120 (described further below).

According to some embodiments, the physical implant process uses argon (Ar) as the source material and the ion beam acceleration system is operated at a first energy level of between about 500 eV and about 3000 eV, such as about 1000 eV. Additionally, the physical implant process may implant dopants in the etch stop layer 113 to a depth equal to about the first thickness Th1 and having a first concentration of between about 1E15 and about 5E15, such as about 2E15.

In some embodiments, during the physical implant process, the dopants may also be implanted in the third dielectric layer 119 along both the top surface of the third dielectric layer 119 and also along the sidewalls of the opening 120, thereby forming a doped dielectric region 303. In an embodiment the doped dielectric region 303 may extend a first depth D1 into the sidewalls of the third dielectric layer 119 of between about 10 nm and about 30 nm, such as about 20 nm, while along the top surface of the third dielectric layer 119 the doped dielectric region 303 may extend a second depth D2 of between about 10 nm and about 100 nm, such as about 20 nm. The doped dielectric region 303 may have a concentration of dopants of between about 1E15 and about 5E15, such as about 2E15. These dopants may remain embedded in the third dielectric layer 119 during further processing of the semiconductor device 100. Such embodiments are discussed in greater detail below.

In another embodiment, an inert material such as argon is not implanted, but, rather, a chemically reactive dopant is implanted. For example, in such a chemical implant process, chemically reactive dopants are implanted to help remove the etch stop layer 113 (e.g., $AlO_x$) exposed within the opening 120. During the chemical implant process, the ion beam system may be used to accelerate ions of the chemically reactive dopants into the target region 301 with enough energy to implant the dopants and initiate a chemical reaction with the material of the etch stop layer 113. The chemically reactive dopants work to either breakdown the material of the etch stop layer 113 (similar to the physical implant process), react with the material of the etch stop layer 113 in order to increase the selectivity of the etch stop layer 113, or else act as a catalyst during the removal of the etch stop layer 113 to assist in the removal of the material from the opening 120.

According to some embodiments, chemically reactive dopants such as fluorine (F), difluoroboron ($BF_2$), combinations thereof, or the like are used as precursors to perform the chemical implant process. According to some embodiments, the chemical implant process is performed by the ion beam acceleration system at a second energy level of between about 500 eV and about 3000 eV, such as about 1000 eV to implant the chemically reactive dopants in the etch stop layer 113. As such, the dopants of the chemical implant process may be implanted and diffused into the etch stop layer 113 to a depth equal to about the first thickness Th1 and having a third concentration of between about 1E15 and about 5E15, such as about 2E15.

Similar to the physical implant process, the chemical implant process will not only implant the chemically reactive dopants into the etch stop layer 113 through the opening 120, but will also implant the chemically reactive dopants into each exposed surface, including the sidewalls of the opening 120 as well as the top surface of the third dielectric layer 119. In an embodiment the chemically reactive dopants may be implanted to a similar depth and to a similar concentration as described above with respect to the physical implant process. However, any suitable depths and any suitable concentrations may be utilized.

FIG. 3B illustrates an etch stop removal step 360 of the etch stop breakthrough process, according to some embodiments. The etch stop removal step 360 uses a recess chemical in a wet breakthrough etch that is selective to the material of the contact etch stop layer 113 (e.g., $AlO_x$) exposed by the opening 120. According to some embodiments, the recess chemical is blended with deionized water (DIW), or a functional DIW such as, carbon dioxide ($CO_2$) blended DIW, ozone ($O_3$) blended DIW, or the like. For instance, in an embodiment in which the contact etch stop layer 113 is $AlO_x$ and the dopant is fluorine (F), $AlF_3$ is formed in a water based solution (e.g., DIW). As such, the chemical reaction in the wet breakthrough etch can be, for example, $3AlF_3 + 6H_2O \rightarrow 3AlO_{2-(aq)} + 6HF$. According to some embodiments, the recess chemical comprises both an etching agent used to selectively remove the materials of the contact etch stop layer 113 and an etching solvent used to help mix and deliver the etching agent without necessarily participating in the etching reaction itself. While the precise etching agent used in the recess chemical depends at least in part on the materials chosen for the contact etch stop layer 113, in an embodiment the recess chemical is formed by blending the etching agent with DIW or a functional DIW (collectively referred to in the example concentration ratios listed below as (DI)). Examples of such recess chemicals include but are not limited to: hydrogen peroxide ($H_2O_2$) at a mixture ratio of between about 1:5 and about 1:30 by volume of $H_2O_2$:DI, ammonium hydroxide ($NH_4OH$) at a mixture ratio of between about 1:5 and about 1:2000 by volume of $NH_4OH$:DI, standard clean-1 (SC1), where SC1 is a mixture of ammonium hydroxide ($NH_4OH$) and hydrogen peroxide ($H_2O_2$) blended with DIW having a mixture ratio of between about 1:1:5 and about 1:1:400 by volume of $NH_4OH$:$H_2O_2$:DI, and standard clean-2 (SC2), wherein SC2 is a mixture of hydrochloric (HCl) acid and hydrogen peroxide ($H_2O_2$) blended with DIW having a mixture ratio of between about 1:1:5 and about 1:1:120 by volume of HCl:$H_2O_2$:DI, combinations thereof, or the like. However, any suitable concentrations may be utilized.

Once prepared, the recess chemical may be dispensed over the semiconductor device 100, according to some embodiments, at a rate of between about 1000 mL/min and about 1500 mL/min, at a process temperature of about room temperature (e.g., 25° C.) to about 65° C. and may be dispensed for a process time of between about 30 sec and about 300 sec, such as about 120 sec. However, any suitable process conditions may be utilized during the dispensing of the recess chemical.

Because the recess chemical is an etchant selective to the material of the contact etch stop layer 113, the dispersal of the recess chemical will selectively remove the material of the etch stop layer 113 without significantly removing other exposed materials (e.g., the third dielectric layer 119 and/or the conductive trench 111). Once the target region 301 of the contact etch stop layer 113 has been removed, an area of the conductive trench 111 is exposed within the opening 120.

However, by increasing the etching rate of the material of the contact etch stop layer 113 and/or by increasing the selectivity of the material of the contact etch stop layer 113 to the material of the third dielectric layer 119, the target region 301 of the contact etch stop layer 113 may be removed without significant removal of the third dielectric layer 119 and without significant lateral etching of the contact etch stop layer 113 itself. For example, in an embodiment in which the breakthrough implant 350 is a physical implant process, the dopants of the physical implant process work to break up the structure of the material of the target region 301, thereby allowing the recess chemical to intrude further within the material of the target region 301 and react with a larger portion of the material of the target region 301 faster. Similarly, in an embodiment in which the breakthrough implant 350 is a chemical implant process, not only will the recess chemical intrude further, but the presence of the chemically reactive dopants will also work to increase the reaction rates of the removal process, e.g., increasing an etch rate of the material of the target region 301 from a first etch rate with respect to a first etchant to a second etch rate faster than the first etch rate. As such, the material of the target region 301 can be removed at a faster rate than otherwise.

Given this faster rate of removal and increased selectivity, the materials (e.g., the third dielectric layer 119) exposed at the sidewalls of the opening 120 experience little to no lateral etching and the profile of the opening 120 is maintained during the wet etch. Similarly, there is little to no lateral etching of the contact etch stop layer 113. Accordingly, the exposed area of the conductive trench 111 has the third width W3.

Once the contact etch stop layer 113 has been etched, a rinse process may be performed to remove any remnants and/or etching residues from the opening 120 so that these remnants and/or etching residues are not present to interfere in later fabrication steps. For example, the rinse process may use a solution containing DI water, carbonized DI water, such as DI water with carbon dioxide, or DI water with $NH_4OH$. The rinse process may be performed at a temperature in a range of about 20 to about 80 degrees Celsius. Furthermore, a drying process may also be performed to dry the surface of the semiconductor device 100. For example, the drying process may include a spin drying of the semiconductor device 100 in the presence of a flow of nitrogen. For example, the drying process may include an isopropyl alcohol (IPA) drying process or an acetone drying process. However, any suitable rinse liquid may be utilized.

Figure 4:
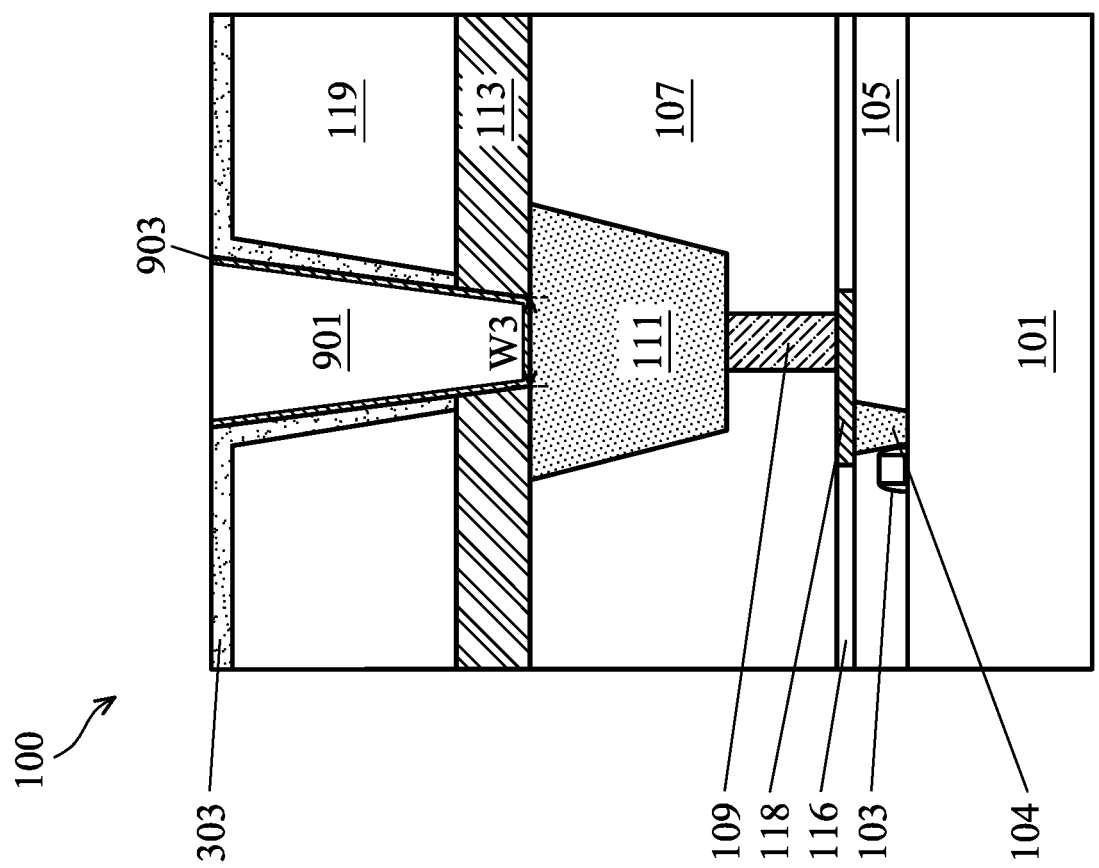
FIG. 4 illustrates a formation of an interconnect, in accordance with some embodiments.

FIG. 4 illustrates a formation of an interconnect 901, in accordance with some embodiments. Once the target region 301 of the contact etch stop layer 113 has been removed and the conductive trench 111 has been exposed, the interconnect 901 may be formed in the opening 120.

According to some embodiments, the interconnect 901 comprises a barrier layer 903 in order to help isolate and protect a subsequently formed conductive material (discussed further below). In an embodiment the barrier layer 903 may comprise materials such as titanium, titanium nitride, combinations of these, or the like, and may be formed using a process such as chemical vapor deposition (CVD), physical vapor deposition (PVD), atomic layer deposition (ALD), or the like. As such, the barrier layer 903 conforms to the shape of the opening 120 along sidewalls of the third dielectric layer 119, the contact etch stop layer 113, planar surface of the conductive trench 111 within the opening 120 and along planar surfaces of the third dielectric layer 119 outside of the opening 120. According to some embodiments, the barrier layer 903 is formed to a thickness of between about 0.1 µm and about 20 µm, such as about 0.5 µm.

Once the barrier layer 903 has been formed, a remainder of the opening 120 is filled with a conductive material to form the interconnect 901. As such, the interconnect 901 and the barrier layer 903 may be formed over the conductive trench 111 having a contact interface at the conductive trench 111 equal to the third width W3.

The conductive material used to form the interconnect 901 may comprise copper, although other suitable materials such as aluminum, alloys, doped polysilicon, cobalt, tungsten, combinations thereof, and the like, may alternatively be utilized. The conductive material may be formed by depositing a seed layer (not separately illustrated), electroplating copper onto the seed layer, and filling and overfilling the opening 120. Once the opening 120 has been filled, excess portions of the barrier layer 903, the seed layer, and conductive material outside of the opening 120 may be removed through a planarization process such as chemical mechanical polishing (CMP), although any suitable removal process may be used.

Figure 5A:
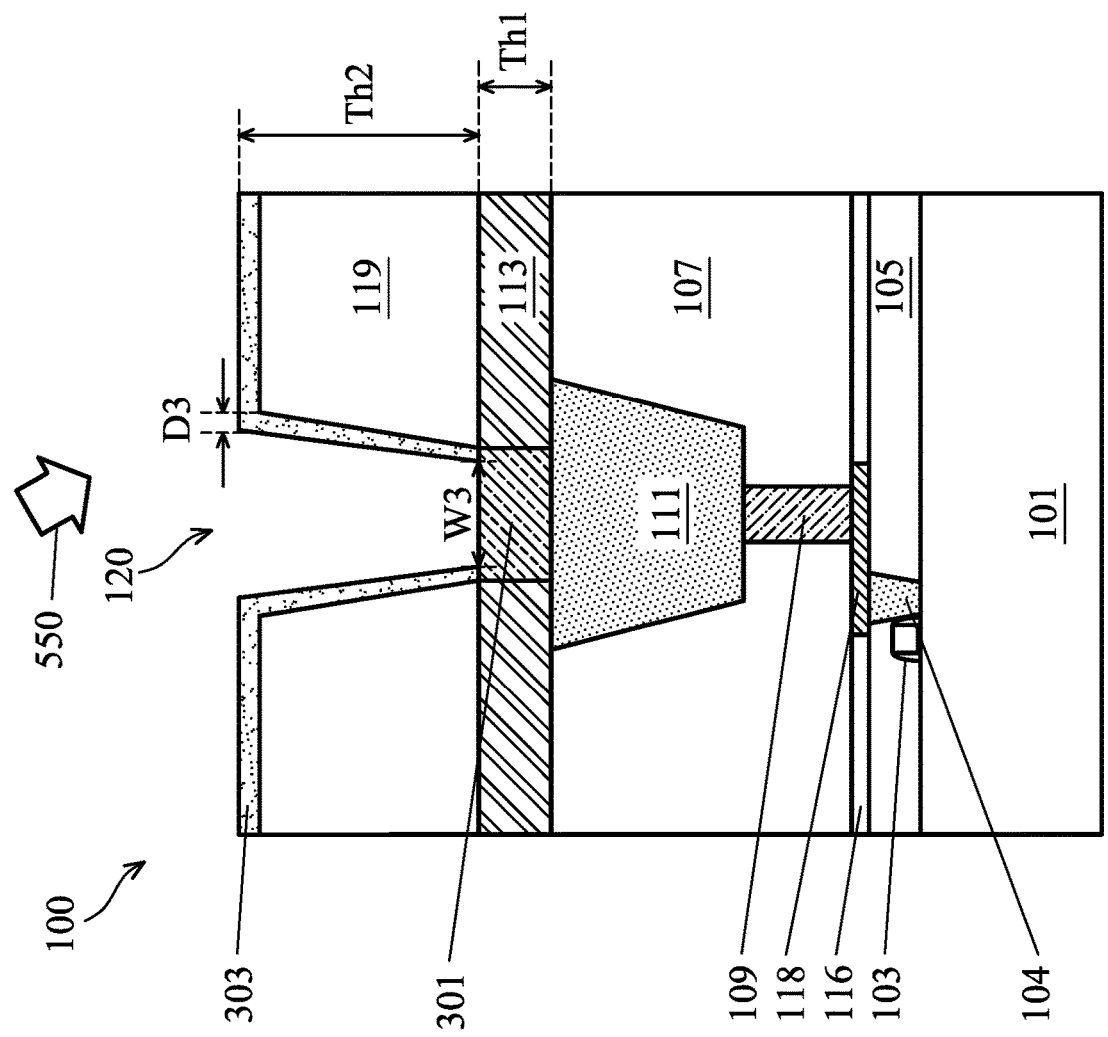
FIGS. 5A-5B illustrate a breakthrough process to form an opening through an etch stop layer, in accordance with another embodiment.
Figure 5B:
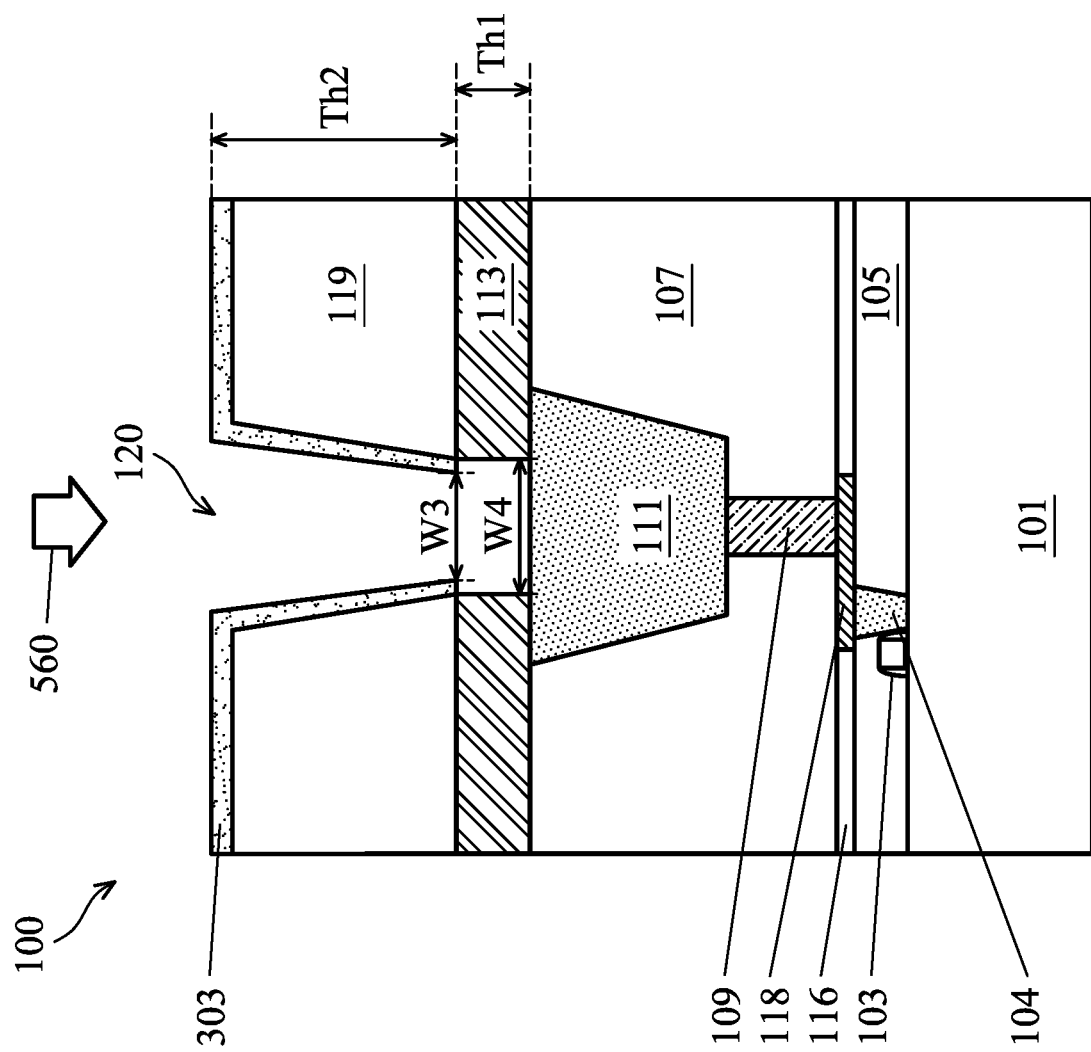

FIGS. 5A and 5B are similar to FIGS. 3A and 3B, respectively, and illustrate intermediate steps in the breakthrough process according to some other embodiments. FIG. 5A illustrates a second breakthrough implant 550, in accordance with some embodiments and FIG. 5B illustrates a second etch stop removal step 560 of the etch stop breakthrough process, according to some embodiments.

FIG. 5A illustrates the second breakthrough implant 550 is performed such that the dopants are implanted at one or more angles and/or laterally diffuse into the sidewalls of the third dielectric layer 119 to a third depth D3 and the dopants may have a fourth concentration by volume within the doped dielectric region 303 of the third dielectric layer 119. According to some embodiments, the first distance D1 may be between about 1 nm and about 3 nm, such as about 2 nm and the fourth concentration may be between about 0% by volume and about 100% by volume, such as about 50% by volume.

FIG. 5B illustrates the second breakthrough etch stop removal step 560 is performed such that the opening 120 through the contact etch stop layer 113 is expanded laterally to a fourth width W4 at the exposed surface of the conductive trench 111. According to some embodiments, the fourth width W4 may be between about 8 nm and about 12 nm, such as about 10 nm. Furthermore, the sidewalls of the opening 120 along the third dielectric layer 119 are doped in FIG. 5B, whereas in FIG. 3B, the sidewalls are not doped.

Figure 6:
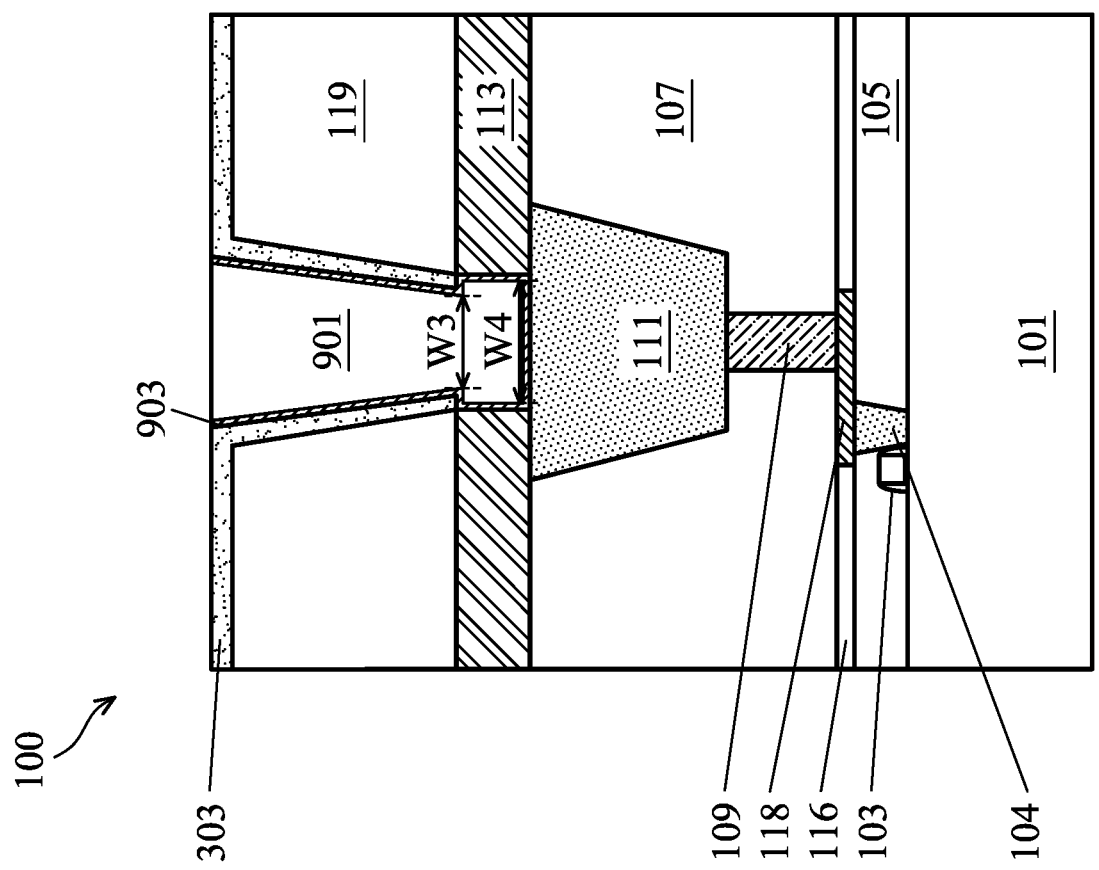
FIG. 6 illustrates a formation of an interconnect, in accordance with another embodiment.

FIG. 6 is similar to FIG. 4 and illustrates the semiconductor device 100, in according to some other embodiments. FIG. 6 illustrates a formation of an interconnect 901 in the opening 120 of FIG. 5B, in accordance with other embodiments. Once the target region 301 of the contact etch stop layer 113 has been removed and the conductive trench 111 has been exposed, the interconnect 901 may be formed in the opening 120 with the implanted dopants remaining embedded in the third dielectric layer 119 at an interface with the interconnect 901.

Once the opening 120 has been formed, the barrier layer 903 and interconnect 901 may be formed within the opening 120 using the materials and processes discussed above with regard to FIG. 4. As such, the interconnect 901 and the barrier layer 903 may be formed over the conductive trench 111 having a contoured plug shape and having a contact interface at the conductive trench 111 equal to the fourth width W4. As such, the interconnect 901 is provided with a complex shape wherein the interconnect 901 will extend between the conductive trench 111 and the third dielectric layer 119, a robust material for the barrier layer 903, and a low resistance interface at the conductive trench 111.

Although embodiments of FIG. 3A further illustrates a breakthrough implant 350, in accordance with some embodiments. As an initial step of the etch stop breakthrough process, the breakthrough implant 350 is performed in a target region 301 of the contact etch stop layer 113. The breakthrough implant 350 may be conducted in a chamber suitable for supporting the semiconductor device 100 and suitable for implanting dopants into the materials being removed.

FIG. 3B illustrates an etch stop removal step 360 of the etch stop breakthrough process, according to some embodiments. The etch stop removal step 360 uses a recess chemical in a wet breakthrough etch that is selective to the material of the contact etch stop layer 113 (e.g., $AlO_x$) exposed by the opening 120. According to some embodiments, the recess chemical is blended with deionized water (DIW), or a functional DIW such as, carbon dioxide ($CO_2$) blended DIW, ozone ($O_3$) blended DIW, or the like.

The etch stop breakthrough process described herein may be performed as part of or in combination with a post via etching clean process and/or may be performed prior to forming a metal plug in the opening 120. The etch stop breakthrough process may be used in applications for forming metal plugs over metal vias comprising materials such as cobalt, tungsten, copper, combinations thereof, or the like. The etch stop breakthrough process may be used in various processes in a beginning end of the line (BEoL) process and/or a middle end of the line (MEoL) process whenever a contact etch stop layer 113 is used at an interface between dielectric layers and an opening is being formed within the dielectric layers. For example, when the etch stop layer 113 is provided at an interface between one or more of the interlayer dielectric layer 105, the first dielectric layer 116, and/or the second dielectric layer 107, the etch stop breakthrough process including the breakthrough implant 350 and etch stop removal step 360 as described herein may be used to form openings in those dielectric layers in preparation of forming one or more of the contact plugs 104, the contact plug trench 118, the first via 109, and the conductive trench 111. Furthermore, any of the conductive materials used to form the interconnect 901 such as copper, tungsten, cobalt, ruthenium, titanium dioxide, aluminum, alloys, doped polysilicon, combinations of these, or the like, may also be used to form the contact plugs 104, the contact plug trench 118, the first via 109, and/or the conductive trench 111. The etch stop breakthrough process may also be applied to multiple technology generations (e.g., N5, N3, N2, or the like).

According to some embodiments, the methods described herein are applicable to multiple technology generations such as N20, N16, N10, N5, N3, N2 and the like. The embodiments disclosed may be used for applications using different metals such as cobalt, tungsten, copper, or the like. The embodiments can be used in many back end of the line (BEoL) processes for applications including post via etch cleaning, contact recessing prior to metal plug formation, or the like. The embodiments may be used to control process time/temperature or chemical compositions to fine tune CESL critical dimension (CD) and MD recessing. The embodiments can be extensively used in middle end of the line (MEoL) and back end of the line (BEoL) processes for the formation of metal plugs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

According to an embodiment, a method includes: forming an opening in a dielectric material, the opening exposing a target region of an etch stop layer overlying a conductive feature; performing a dopant implantation in the target region; and performing an etch to remove a portion of the etch stop layer materials in the target region and to expose the conductive feature. In an embodiment, the etch stop layer comprises aluminum oxide. In an embodiment, the dopant implantation comprises a physical implantation. In an embodiment, the physical implantation uses argon as a source material. In an embodiment, the dopant implantation comprises a chemical implantation. In an embodiment, the chemical implantation uses fluorine as a source material. In an embodiment, the dopant implantation implants dopants in sidewalls of the opening.

According to another embodiment, a method includes: depositing an etch stop layer over a metallization layer in a first dielectric layer, the etch stop layer having a first etch rate with respect to a first etchant; depositing a second dielectric layer over the etch stop layer; forming a via opening through the second dielectric layer, the via opening exposing the etch stop layer; performing an ion implantation in the etch stop layer through the opening, the ion implantation modifying the first etch rate to a second etch rate with respect to the first etchant; and performing a removal process with the first etchant after the performing the ion implantation, the metallization layer being exposed through the via opening. In an embodiment, the performing the removal process comprises a wet etch. In an embodiment, the etch stop layer comprises aluminum oxide ($AlO_x$), and the first etchant comprises deionized water. In an embodiment, the ion implantation implants a chemically neutral ion. In an embodiment, the chemically neutral ion is argon. In an embodiment, the ion implantation implants a chemically reactive ion. In an embodiment, the chemically reactive ion comprises fluorine.

According to yet another embodiment, a semiconductor device includes: a metallization layer over a semiconductor substrate; an etch stop layer over the metallization layer; an interlayer dielectric layer over the etch stop layer; a metal plug through the interlayer dielectric layer and through the etch stop layer; and a dopant implant region within the interlayer dielectric layer and located adjacent to a first surface of the interlayer dielectric layer and also adjacent to a second surface of the interlayer dielectric layer, the first surface being in physical contact with the metal plug and the second surface being located on an opposite side of the interlayer dielectric layer than the etch stop layer. In an embodiment the metal plug extends between the dopant implant region and the metallization layer in a direction perpendicular with a major surface of the semiconductor substrate. In an embodiment the interlayer dielectric layer has a sidewall that is aligned with a sidewall of the etch stop layer. In an embodiment the dopant implant region comprises argon. In an embodiment the dopant implant region comprises fluorine. In an embodiment the etch stop layer comprises aluminum oxide.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
forming an opening in a dielectric material, the opening exposing a target region of an etch stop layer overlying a conductive feature, the target region having a first etch rate with respect to an etchant;
performing a dopant implantation on a sidewall of the dielectric material and a top surface of the etch stop layer through the opening to form a first dopant implant region in the dielectric material and a second dopant implant region in the etch stop layer, wherein the second dopant implant region comprises a portion below the first dopant implant region; and
performing an etch process to remove the second dopant implant region to expose the conductive feature, wherein after removing the second dopant implant region, the etch stop layer comprises a non-doped region in physical contact with a bottom of the first dopant implant region in the dielectric material.

2. The method of claim 1, wherein the second dopant implant region has a second etch rate with respect to the etchant, wherein the second etch rate is different from the first etch rate.

3. The method of claim 2, wherein the second etch rate is greater than the first etch rate.

4. The method of claim 1, wherein the second dopant implant region is not in physical contact with a bottom of the first dopant implant region.

5. The method of claim 1, wherein the second dopant implant region has a sidewall connected to a sidewall of the first dopant implant region, wherein a first angle between the sidewall of the first dopant implant region and a bottom surface of the dielectric material is different from a second angle between the sidewall of the second dopant implant region and a bottom surface of etch stop layer.

6. The method of claim 5, wherein the first angle is less than the second angle.

7. The method of claim 1, wherein the second dopant implant region has a width ranging from 8 nm to 12 nm.

8. The method of claim 1, wherein a thickness of the first doped implant region in a direction perpendicular to a top surface of the dielectric material is smaller than a thickness of the dielectric material.

9. The method of claim 1, further comprising forming a metal plug in the opening and in the etch stop layer after removing the second dopant implant region, wherein the metal plug is in physical contact with the non-doped region of the etch stop layer.

10. A method of manufacturing a semiconductor device, the method comprising:
depositing an etch stop layer over a first dielectric layer, the etch stop layer having a first etch rate with respect to an etchant;
depositing a second dielectric layer over the etch stop layer;
forming a first via opening through the second dielectric layer and exposing the etch stop layer;
performing an ion implantation through the first via opening, the ion implantation modifying the second dielectric layer to comprise a first doped region adjacent a sidewall of the second dielectric layer and modifying the etch stop layer to comprise a second doped region, wherein a bottom of the first doped region of the second dielectric layer connects to the second doped region of the etch stop layer;
performing a removal process with the etchant after the performing the ion implantation to remove the second doped region and form a second via opening in the etch stop layer; and
forming a metal plug in the first via opening and the second via opening, wherein the metal plug comprises a barrier layer in the first via opening and in the second via opening, wherein the barrier layer in the second via opening is in physical contact with the bottom of the first doped region of the second dielectric layer.

11. The method of claim 10, wherein the second doped region of the etch stop layer has a second etch rate with respect to the etchant, wherein the second etch rate is different from the first etch rate.

12. The method of claim 11, wherein the second etch rate is greater than the first etch rate.

13. The method of claim 10, wherein the second doped region has a sidewall connected to a sidewall of the first doped region.

14. The method of claim 13, wherein a first angle between the sidewall of the first doped region and a bottom surface of the second dielectric layer is different from a second angle between the sidewall of the second doped region and a bottom surface of etch stop layer.

15. The method of claim 10, wherein a bottom of the second via opening is wider than a bottom of the first via opening.

16. A method of manufacturing a semiconductor device, the method comprising:
forming an etch stop layer over a metallization feature;
forming an interlayer dielectric layer over the etch stop layer;
forming a first opening through the interlayer dielectric layer and exposing the etch stop layer;
performing a dopant implantation on a sidewall of the interlayer dielectric layer and a top surface of the etch stop layer through the first opening to form a first dopant implant region in the interlayer dielectric layer and a second dopant implant region in the etch stop layer, wherein a bottom of the second dopant implant region is wider than a bottom of the first opening; and
performing a removal process to remove at least a portion of the second dopant implant region and form a second opening in the etch stop layer, wherein the bottom of the second opening is wider than the bottom of the first opening.

17. The method of claim 16, wherein a width of the second opening is smaller than a width of the metallization feature.

18. The method of claim 16, further comprising forming a metal plug in the first opening and the second opening.

19. The method of claim 18, wherein the metal plug is in physical contact with a bottom of the first dopant implant region.

20. The method of claim 16, wherein the second dopant implant region has a sidewall connected to a sidewall of the first dopant implant region.

* * * * *